(12) United States Patent
Harrer et al.

(10) Patent No.: US 8,053,675 B2
(45) Date of Patent: Nov. 8, 2011

(54) APPARATUS FOR BALANCING POWER PLANE PIN CURRENTS IN A PRINTED WIRING BOARD USING COLLINEAR SLOTS

(75) Inventors: Hubert Harrer, Schoenaich (DE);
Andreas Huber, Austin, TX (US);
Thomas-Michael Winkel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 596 days.

(21) Appl. No.: 12/145,502

(22) Filed: Jun. 25, 2008

(65) Prior Publication Data

US 2008/0257592 A1 Oct. 23, 2008

Related U.S. Application Data

(63) Continuation of application No. 11/050,602, filed on Feb. 3, 2005, now Pat. No. 7,418,779.

(51) Int. Cl.
*H05K 1/00* (2006.01)
*H05K 1/11* (2006.01)
*H05K 1/14* (2006.01)

(52) U.S. Cl. .................. 174/255; 174/261; 361/794

(58) Field of Classification Search .......... 361/792–795; 174/255, 261
See application file for complete search history.

(56) References Cited

U.S. PATENT DOCUMENTS

| | | | |
|---|---|---|---|
| 5,523,921 A | 6/1996 | Van Lydegraf | |
| 6,091,609 A | 7/2000 | Hutson et al. | |
| 6,496,383 B1 | 12/2002 | Herrell et al. | |
| 6,640,435 B2 | 11/2003 | Balakrishnan | |
| 7,250,913 B2 | 7/2007 | Chang et al. | |
| 7,459,985 B2 | 12/2008 | Mellitz et al. | |
| 7,598,913 B2 | 10/2009 | Rao et al. | |
| 2002/0044022 A1 | 4/2002 | Shintani et al. | |
| 2004/0053635 A1 | 3/2004 | Haapala et al. | |

OTHER PUBLICATIONS

Office Action in U.S. Appl. No. 11/050,602 on Feb. 6, 2008.
Flamm, Jeurgen, Using Allegro PCB SI to Analyze a Boards Power Delivery System From Power Source to Die Pad, pp. 1-11, Cadence Design System, 2002.
Office Action in U.S. Appl. No. 11/936,673 dated Jun. 2, 2010.
Notice of Allowance in U.S. Appl. No. 11/050,602 dated Jun. 13, 2008.

*Primary Examiner* — Jeremy Norris
(74) *Attorney, Agent, or Firm* — Mitch Harris, Atty at Law, LLC; Andrew M. Harris; Matthew W. Baca

(57) ABSTRACT

Printed wiring board (PWB) provides for reduction in pin counts required for power plane (including ground plane) connections and/or reduction in requirements for connector current handling per pin. Multiple collinear slots in the form of a dashed line are introduced in the metal layer implementing the power plane that alter the current distribution in the power plane and improve the strength of the PWB. The per-pin current profile for connector pins connected to the power plane is equalized by tuning the length of the slot(s). The slots are dashed and may be made internal to the power plane metal layer to avoid weakening the metal layer for laminated multi-layer PWBs and may be shaped around a connector end when the power plane pin allocation is not uniform at the connector ends. The resulting equalization reduces either pin count required for carrying the power plane current or reduces connector pin current requirements.

6 Claims, 6 Drawing Sheets

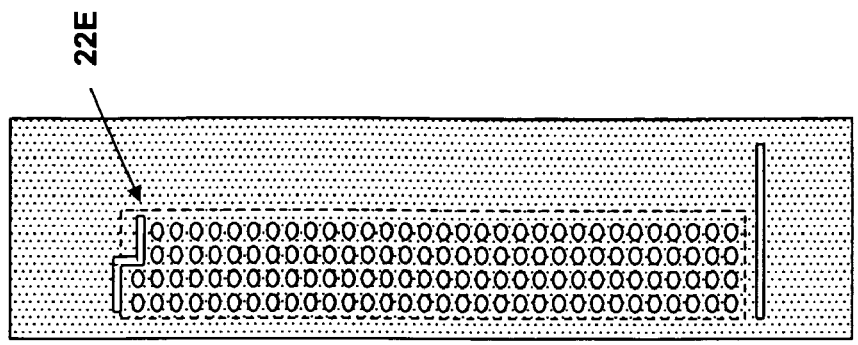
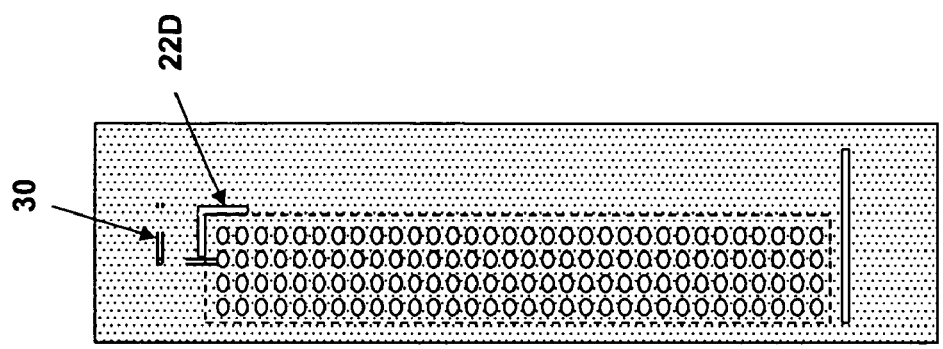
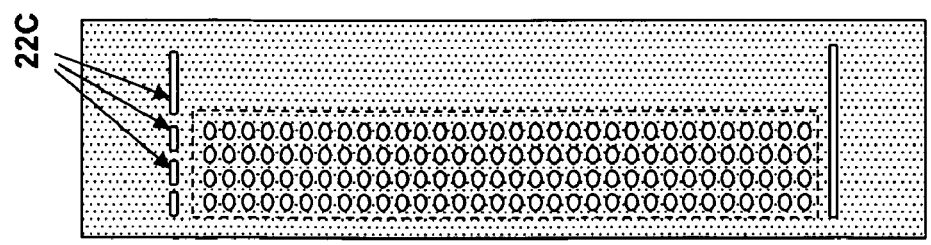
Fig. 3C
Fig. 3B
Fig. 3A

US 8,053,675 B2

APPARATUS FOR BALANCING POWER PLANE PIN CURRENTS IN A PRINTED WIRING BOARD USING COLLINEAR SLOTS

This application is a Continuation of U.S. patent application Ser. No. 11/050,602, filed on Feb. 3, 2005 now U.S. Pat. No. 7,418,779.

BACKGROUND OF THE INVENTION

1. Technical Field

The present invention relates generally to electrical and electronic circuits and systems fabricated on printed wiring boards and more specifically to a computer program product embodying a method for balancing power plane pin currents and printed wiring board having balanced pin currents.

2. Description of the Related Art

Printed wiring boards (PWBs), also referred to as printed circuit boards (PCBs) have been in use for decades for fabricating circuits and entire systems. The PWBs provide the interconnects for discrete and integrated components and subsystems and provide power paths or power planes for interconnecting the components to power supplies.

Power distribution in PWBs has always been a concern and in particular, high current systems such as today's processing systems and interchangeable processing sub-units ("blades") require the handling of very high currents per PWB on some power supply connections, which can generate substantial voltage drops within the PWB conductor(s) and require multiple connector pins or other connector contacts connected in parallel to carry the amount of current supplied to a particular power supply distribution net.

To alleviate the voltage drop problem (and also provide electromagnetic shielding), processing systems and subsystems integrated on a PWB typically use specific layers of a multilayer PWB to carry the power supply voltages and returns or may include a few other connections, but will primarily be power supply layers. A layer dedicated to power supply distribution may actually include multiple power planes distributing two or more separate power supply outputs or may be dedicated to distributing a single power supply output.

The large metal areas typically used for power planes reduces the voltage drop to the connector pins or other terminals used to connect the PWB to a power supply. However, differential voltages exist between the power supply terminal connections, even with a continuous metal plane, because of differing resistive path lengths between the terminals and the current sinks or sources (e.g., a large current consumer such as a processor) and the individual terminals. Additionally, the current distribution in the power plane metal, which is not uniform, contributes to the differential voltages between the terminals, and the differential voltages cause non-uniform distribution of terminal currents. In general: 1) terminals that are closer to the current sources and sinks (i.e., the device power terminals) on the PWB carry more current due to the shorter paths; and 2) terminals that are toward the outside of the terminal array carry higher currents due to the decreased current density away from the center of the connector length (because of lowered voltage drop per unit length along the paths passing through lower current density regions). Both of the above-recited factors superimpose to yield a particular terminal current distribution for each power plane and for each PWB/terminal configuration.

In present-day systems, such as large scalable server systems operating at relatively low voltages, the current levels per PWB and per-terminal are very large. As such, a significant amount of power is dissipated in the connectors due to pin resistance and in the PWBs themselves due to the finite conductivity of the metal layers used to implement the power planes. The use of thin laminated PWBs having many layers also increases the effective resistance of the paths between devices on the PWB and the connector terminals, leading to an increase in the terminal current distribution described above.

The disparity in terminal currents leads to a need to over-specify a connector for pin current handling, which is typically set by the maximum power dissipation through the pin and the overall tolerable pin resistance (dictated by the maximum voltage drop(s) to the components on the PWB). Alternatively, an increase in the total number of terminals required to couple the power supply to the PWB power plane(s) is required.

Also, overall power dissipation is increased by a disparate terminal current distribution. Because the power dissipation per terminal (both in the power plane and the connector pin) is a function of the square of the current through the terminal, the average power dissipation in a connector is not constant over all the possible terminal current distributions, but is at a minimum when the terminal current distribution is equal. For example, for two terminals carrying a total of 4 A, if the pin currents are equal, the power dissipation in watts is 8R where R is the resistance of the pins. If the pin currents are 1 A and 3 A respectively, the power dissipation in watts is 10R. Equalizing the terminal current distribution minimizes the power dissipation in the connector, as well as generally minimizing average power dissipation in the power plane metal area.

It is therefore desirable to provide a method for PWB power plane design and a PWB power plane implementation that equalizes the connector terminal currents for power supply connections.

SUMMARY OF THE INVENTION

The objective of equalizing terminals currents at a PWB connection is provided in a method for PWB design and a PWB design that alters power plane current distribution to equalize the current distribution among multiple terminals commonly connected to the power plane. The method is embodied in a computer program product for PWB design.

A plurality of collinear slots are introduced in the power plane or between two power planes to alter the current distribution in the power plane(s) so that current through power supply connection terminals commonly connected to the power plane(s) is equalized. The slots are arranged in a form of a dashed line and improve the strength of the PWB, as well as altering the current distribution.

The slots may be introduced beyond each physical end of a connector and the slot lengths tuned to equalize the currents between the power plane and terminals of the connector connected to the power plane. The dashed line arrangement reduces structural weakening at the edge of the PWB for thin laminated PWBs, in particular, to reduce bending or tearing during lamination of metal layers with dielectric layers. The slot may also be shaped around a connector end when connector column lengths are not equal or when the power plane terminals are not evenly distributed across rows of the connectors at an end of a connector.

Multiple power planes within a single layer of a PWB may have connection currents tuned in the above manner and/or multiple layers having power planes within a single PWB may be likewise tuned.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

FIGS. 3A, 3B and 3C are pictorial diagram showing details of power plane layer designed in accordance with other embodiments of the invention.

DESCRIPTION OF ILLUSTRATIVE EMBODIMENT

Figure 1A:
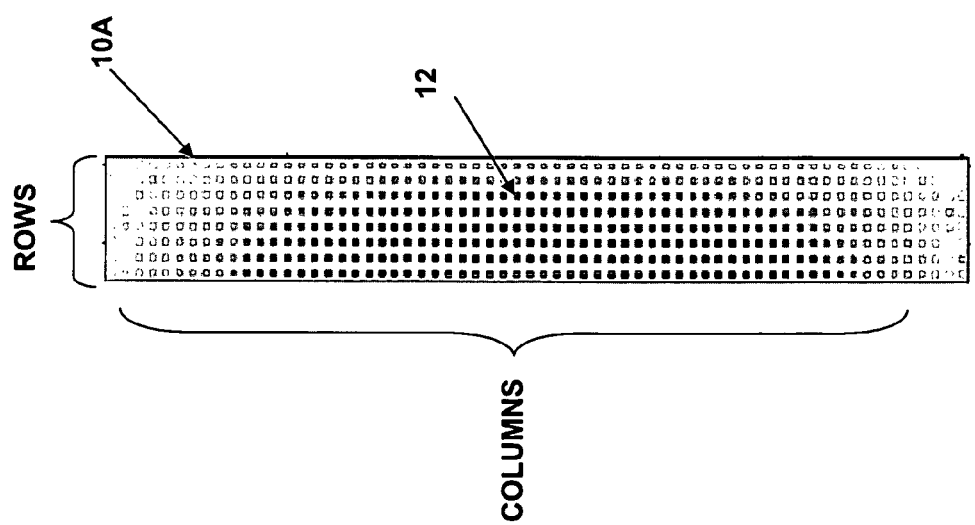
FIGS. 1A and 1B are current distribution diagrams comparing a current distribution of a prior art PWB with a PWB designed in accordance with an embodiment of the invention.
Figure 1B:
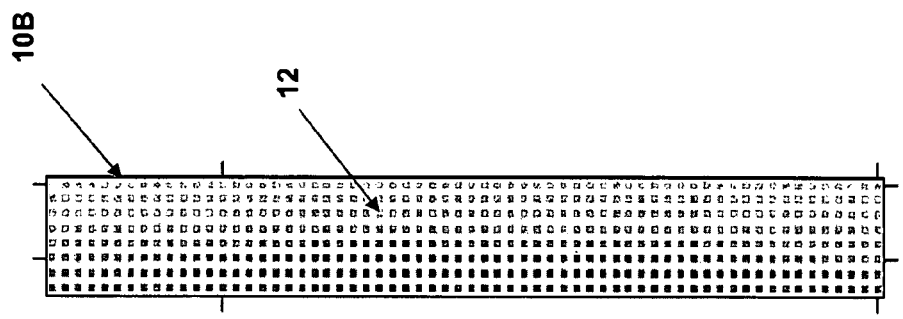

With reference now to the figures, and in particular with reference to FIGS. 1A and 1B, advantages of the techniques of the present invention are illustrated by pictorial diagrams that show the current distribution between terminal lands 12 of a connector mounting area 10A, 10B. In FIG. 1A, a standard PWB current distribution is shown, with the brightness of terminal lands 12 indicating the current level at that terminal when the connector terminals are commonly connected to a power supply output. A solid copper layer is generally used to implement a power plane (including ground planes) and the voltage rise at terminal lands 12 is typically higher toward the center of the connector or in locations where the highest current consumers (or providers for return planes) are located. For this example, a high current consumption is assumed parallel to the center of the connector, but the techniques of the present invention may be applied to any terminal current distribution. The increased voltage rise leads to less actual current being provided or accepted by the power supply output as shown by the darker (lower current) terminals, resulting in an unequal distribution of current among the power supply terminals at a connector. The amount of current drawn by a terminal is a function of both the path length and the current density along the path from the power supply connection of the devices mounted on the PWB to the terminal. Since the current density is higher toward the center of the connector, but the path length is lower (assuming the device are centered on the PWB), the lowest current terminals are disposed toward the center of the connector and toward the edge of the connector mounting area farthest from the devices, as shown in FIG. 1A.

It is highly desirable to equalize the current distribution among the terminals, as the maximum current per terminal generally determines the minimum number of connector terminals for a given power plane. Alternatively, or partially in conjunction, the minimum current handling for the terminal pins, maximum voltage rise for a terminal pin or wiring/backplane from the power supply if individual runs are employed, and the individual current handling of individual runs can be relaxed if the terminal current distribution is equalized. Further, due to the square-law relationship of power vs. current, overall power dissipation in the connector and the PWB is reduced when terminal currents are equalized.

FIG. 1B shows an equalized current distribution across terminals 12 in connector mounting area 10B of a PWB in accordance with an embodiment of the invention. The overall shading of terminals 12 compared to terminals 12 in FIG. 1B shows that the current per pin has been equalized over that of FIG. 1A. The connector terminal lands in the central rows of connector mounting area 10B, and in particular those farthest away from the PWB devices (toward the left of the figure) are carrying more current than the same terminals in the PWB illustrated by FIG. 1A. The terminal lands toward the ends of connector mounting area 10B are carrying less current in the PWB illustrated by FIG. 1B than in the PWB illustrated in FIG. 1A. In general, the minimum and maximum terminal currents are much closer in FIG. 1B than for the terminal currents depicted in FIG. 1B and therefore, the power dissipation in the connector and PWB is significantly lower. The reduction of the maximum terminal current permits increased terminal current handling margins, reduced terminal specification requirements and/or a reduced number of terminals required for the power plane connections.

Figure 2:
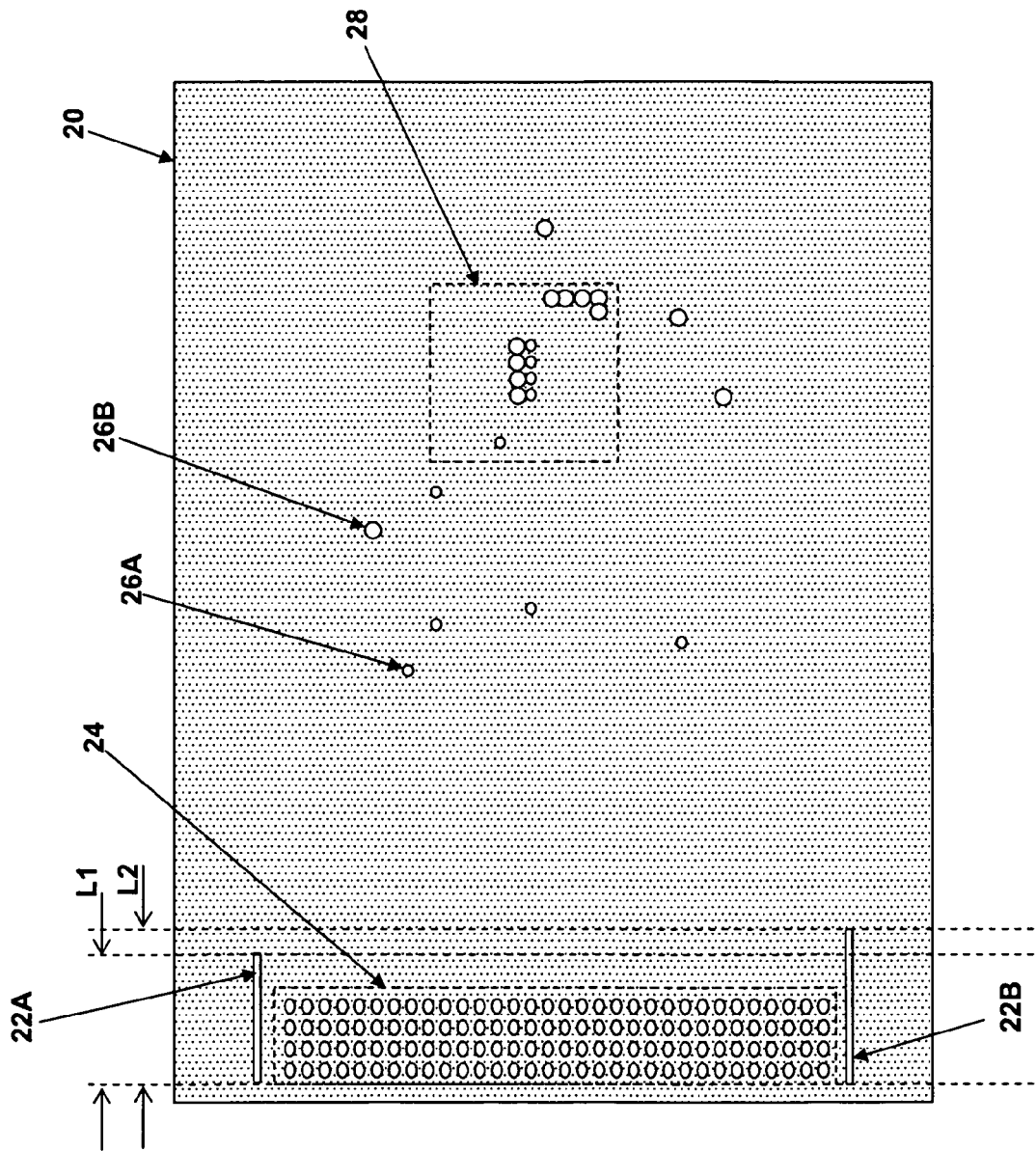
FIG. 2 is a pictorial diagram depicting a PWB power plane layer in accordance with an embodiment of the invention.

Referring now to FIG. 2, a power plane 20 (single metal layer) of PWB in accordance with an embodiment of the invention is shown. Two slots 22A and 22B are introduced in power plane 20 that alter the current density near the ends of connector mounting area 24 and having tuned lengths L1 and L2, respectively that are adjusted to substantially equalize the connector terminal currents. Other features of power plane 20 include through holes 26B for passage of signal and other connections not connected to power plane 20, and power plane terminals 26A for receiving blind vias or leads that connect to power plane 20. Also illustrated is an integrated circuit package mounting area 28 such as a processor that is a high current consumer that generates the "current crowding" problem solved by the present invention.

While FIG. 2 illustrates only one power plane 20, it should be understood that the technique applied to power plane 20 can be applied to every power plane in a PWB, permitting equalization of terminal currents in groups corresponding to each power supply output connected to an associated PWB power plane. The slot lengths can be determined individually for each power plane based on the amount of correction needed for the particular plane in order to equalize the terminal currents for each and all planes.

Referring now to FIG. 3A, another type of slot 22C that can be used to alter current density and equalize terminal current distribution is shown. The dashed line form of slot 22C is used to avoid reducing the strength of a metal layer, especially toward the edges, where tearing may occur during handling or lamination of built-up PWBs.

Referring now to FIG. 3B, yet another type of slot 22D that can be used to alter current density and equalize terminal current distribution is shown. The bent line form of slot 22D is used to permit critical signal traces 30 to be routed around the ends of connector mounting area 24, as the impedance and electromagnetic coupling of signal trace 30 would be affected by a slot such as slot 22A of FIG. 2, which would cross signal trace 30.

Referring now to FIG. 3C, still another type of slot 22E that can be used to alter current density and equalize terminal current distribution is shown. The jogged line form of slot 22E is used when the terminals of a connector are unused (as depicted, there are no connections to two locations), or when the power plane terminals in the row(s) at the end of the connector are not evenly distributed. The jog in the line alters the current distribution in both directions of the connector, permitting equalization of the terminal current distribution even when the terminals are not evenly distributed to the power plane.

Figure 4:
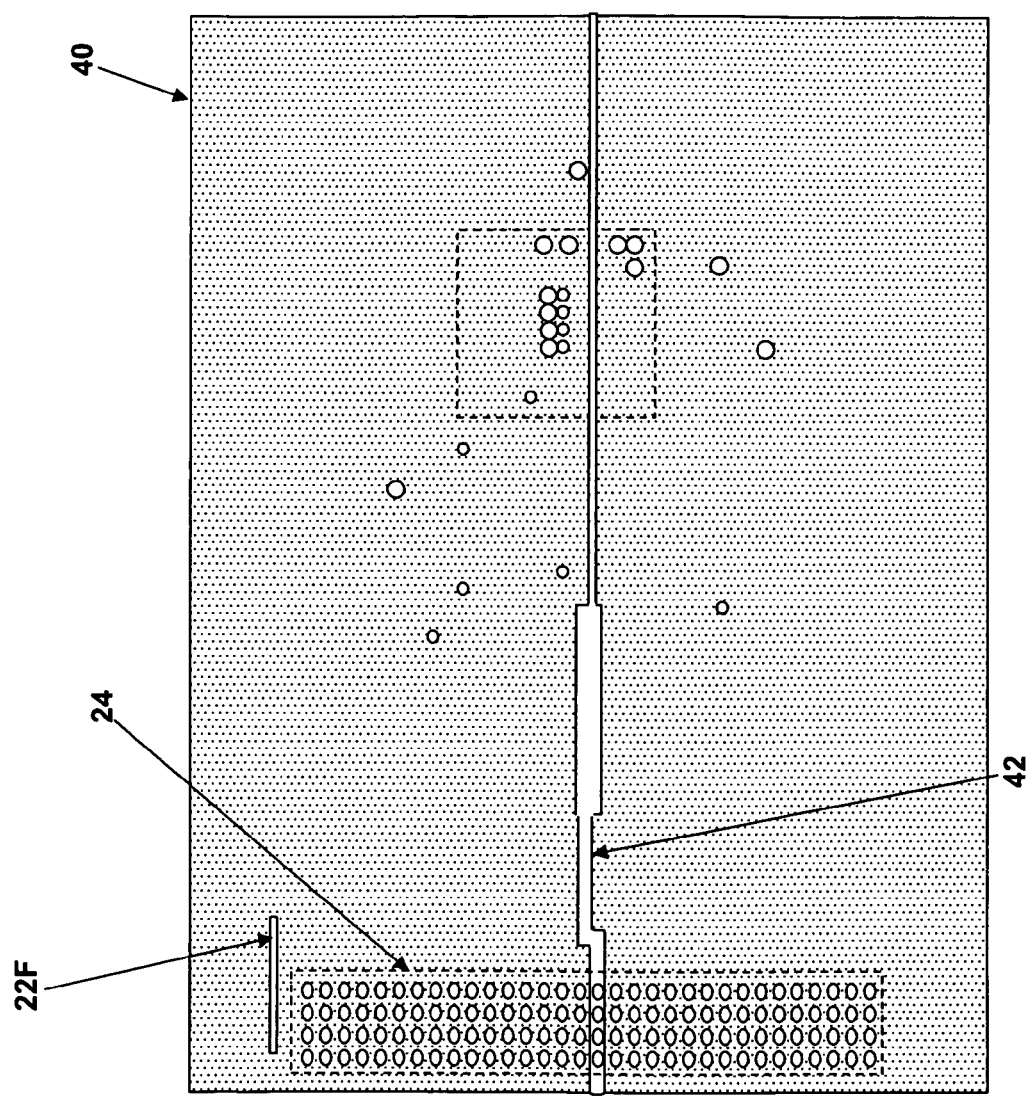
FIG. 4 is a pictorial diagram depicting a multi-power plane PWB layer designed in accordance with another embodiment of the invention.

Referring now to FIG. 4, a metal layer 40 of a PWB having multiple power planes on a single layer is shown. Such a PWB is illustrative of an application where there are multiple processors on a PWB, each having an individual power supply output providing their power. Rather than slots placed at ends of the connector, the multi-power plane solution of the present invention provides for use of a gap 42 between the power planes as a tuning mechanism for altering current distribution among the terminals connecting each power plane to its corresponding power supply output. The position and/or width of gap 42 can be altered, as shown, to make changes in the current distribution of each power plane where required, yielding an equalized terminal current distribution for each of the power planes. Additionally, slots such as slot 22F having a tuned length as described above with respect to FIG. 2, may be used to equalize the terminal current distribution(s) on one or more of the power planes with respect to the connected terminals.

Figure 5:
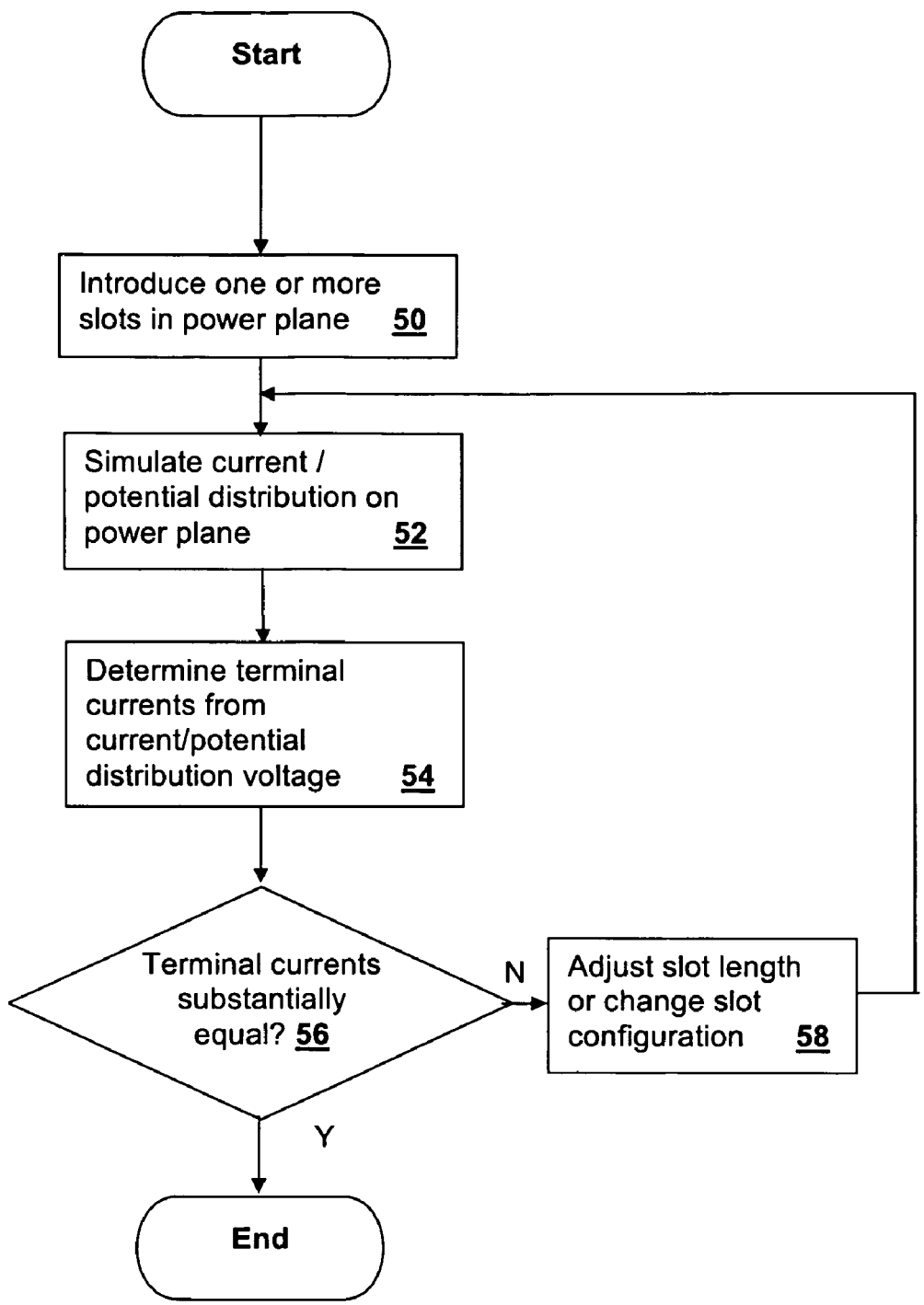
FIG. 5 is a flowchart depicting a method in accordance with an embodiment of the present invention.

Referring now to FIG. 5, a method in accordance with an embodiment of the present invention is depicted. First, a PWB metal layer is set up for simulation by introducing one or more slots (step 50). Next, the current and potential across the metal are simulated for known circuit conditions (step 52). Then, from the distributions computed in step 52, the terminal current distribution is determined (step 54) and the distribution is tested for equality and/or convergence criteria (decision 56). If the criteria are not met, the slot lengths are adjusted (step 58), a slot may also be removed, added or relocated and then steps 50-56 are repeated. Other techniques may be used in accordance with other embodiments of the invention, including determination of the current/potential distribution by actual measurement and/or calculation of initial slot dimensions from empirical models applied to actual or simulated terminal current distributions or condensed statistics such as the current deviation. In general, the techniques of the present invention provide a mechanism via the slots, by which the current distribution is equalized as best as possible by tuning the slot lengths.

Figure 6:
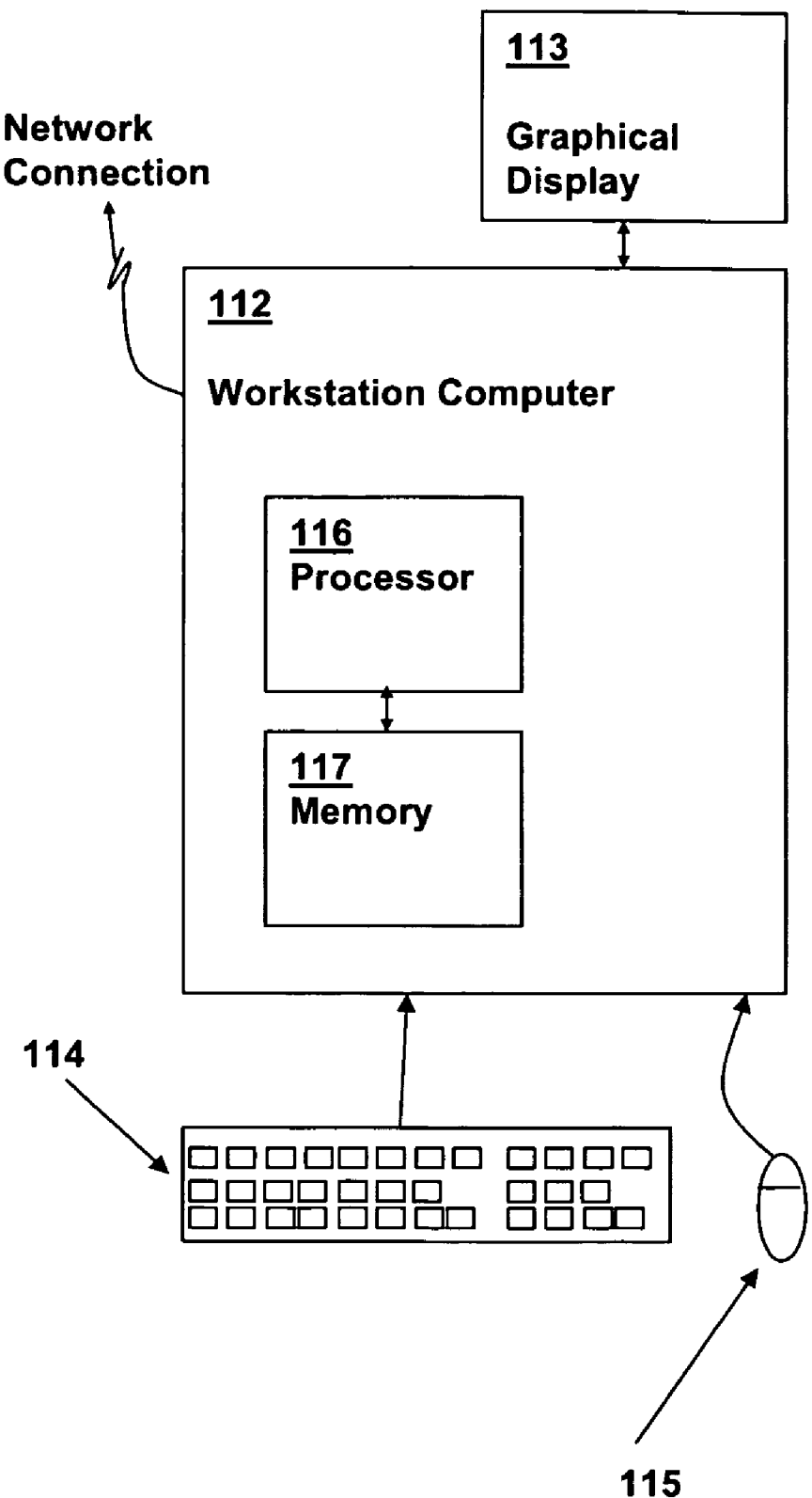
FIG. 6 is a pictorial diagram depicting a workstation computer system in which the method of FIG. 5 can be practiced by executing program instructions of a computer program product in accordance with an embodiment of the present invention.

Referring now to FIG. 6, a workstation computer system, in which methods according to an embodiment of the present invention are performed, is depicted. A workstation computer 112, having a processor 116 coupled to a memory 117, for executing program instructions from memory 117, wherein the program instructions include program instructions for executing one or more methods in accordance with an embodiment of the present invention.

Workstation computer 112 is coupled to a graphical display 113 for displaying program output such as simulation results and power plane and circuit layout structure input, design and verification programs implementing embodiments of the present invention. Workstation computer 112 is further coupled to input devices such as a mouse 115 and a keyboard 114 for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 112.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A printed wiring board (PWB), comprising:
at least one power plane comprising a large metal area for connecting power connections of circuits mounted on said PWB to a power supply; and
a plurality of terminals for providing connection of said power plane to said power supply, and wherein said power plane defines a plurality of collinear slots in the form of a dashed line proximate the terminals and having a tuned length for altering a current density of the power plane in the vicinity of said at least one slot in order to equalize currents flowing through said terminals, and wherein said power plane is laminated with other layers of said PWB with dielectric layers between, whereby said dashed line improves a strength of said power plane to avoid damaging said power plane during handling and lamination.

2. The printed wiring board of claim 1, wherein said plurality of collinear slots forms at least one longer slot in a set of two slots, one disposed at a first end of a connector mounting area containing said plurality of terminals and one disposed at a second end of said connector mounting area, and wherein each of said set of two slots has a unique tuned length to attain a substantially equal current distribution among said plurality of terminals.

3. The printed wiring board of claim 1, wherein said plurality of terminals are terminals for mounting a multi-row connector and wherein said plurality of terminals are not evenly distributed across rows of said connector at an end of said multi-row connector, wherein said plurality of collinear slots is disposed at said end of said connector, and wherein said plurality of collinear slots is shaped to improve equality of current distribution across said rows at said end of said connector.

4. The printed wiring board of claim 1, further comprising at least one other power plane, each of said power planes comprising a large metal area defining at least one other slot for altering a current flow in the vicinity of said at least one slot, and wherein each of said at least one other slot has a unique tuned length adjusted to equalize a current distribution in terminals connecting each of said other metal layers to a respective power supply output.

5. The printed wiring board of claim 1, wherein said PWB comprises at least one other power plane comprising a second large metal area located on the same layer as said at least one power plane, and wherein said at least one power plane and said at least one other power plane define said at least one slot by a boundary gap between said at least one power plane and said at least one other power plane, and wherein a shape of said at least one slot is tuned to equalize said current distribution and to further equalize a current distribution in terminals connecting said at least one other power plane to a power supply output.

6. A printed wiring board (PWB), comprising:
at least one power plane comprising a large metal area for connecting power connections of circuits mounted on said PWB to a power supply; and
a plurality of terminals for providing connection of said power plane to said power supply, and wherein said power plane defines a plurality of collinear slots in the form of a dashed line proximate the terminals and having tuning means for altering a current density of the power plane in the vicinity of said at least one slot in order to equalize currents flowing through said terminals, and wherein said power plane is laminated with other layers of said PWB with dielectric layers between, whereby said dashed line improves a strength of said power plane to avoid damaging said power plane during handling and lamination.

* * * * *